Figure 1:
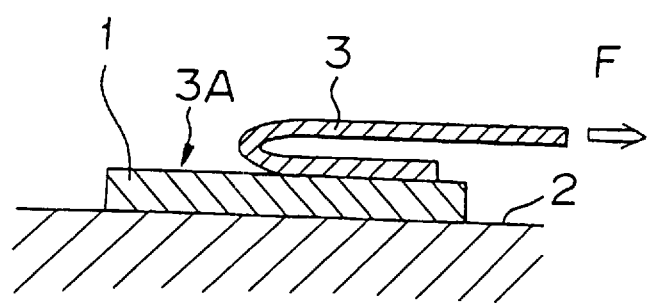

United States Patent [19]
Urano et al.

[11] Patent Number: 5,863,678
[45] Date of Patent: Jan. 26, 1999

[54] PHOTOPOLYMERIZABLE COMPOSITION FOR A COLOR FILTER

[75] Inventors: Toshiyuki Urano; Shingo Ikeda; Etsuko Hino; Shin Kawana; Takeshi Ohmori, all of Yokohama; Koji Mori, Fukuoka, all of Japan

[73] Assignee: Mitsubishi Chemical Corporation, Tokyo, Japan

[21] Appl. No.: 587,483

[22] Filed: Jan. 17, 1996

[30] Foreign Application Priority Data

| Jan. 17, 1995 | [JP] | Japan | 7-004899 |
| Jul. 20, 1995 | [JP] | Japan | 7-183898 |
| Jul. 26, 1995 | [JP] | Japan | 7-190656 |
| Aug. 7, 1995 | [JP] | Japan | 7-200789 |

[51] Int. Cl.$^6$ .............. G02B 5/20; G03F 7/029
[52] U.S. Cl. .............. 430/7; 430/281.1; 522/29; 522/66
[58] Field of Search .......... 430/7, 281.1, 292, 430/293; 349/110; 522/27, 29, 66, 26, 28, 121

[56] References Cited

U.S. PATENT DOCUMENTS

| 5,121,237 | 6/1992 | Ikeda et al. | 349/110 |
| 5,362,603 | 11/1994 | Katoh et al. | 430/281.1 |
| 5,368,976 | 11/1994 | Tajima et al. | |
| 5,498,641 | 3/1996 | Urano et al. | |
| 5,622,794 | 4/1997 | Sato et al. | 430/7 |

FOREIGN PATENT DOCUMENTS

| 0 320 264 | 6/1989 | European Pat. Off. |
| 0 359 934 | 3/1990 | European Pat. Off. |
| 0 539 606 | 5/1993 | European Pat. Off. |
| 0 571 625 | 12/1993 | European Pat. Off. |
| 5-323607 | 12/1993 | Japan . |
| 2 273 101 | 6/1994 | United Kingdom . |

OTHER PUBLICATIONS

Abstract of JP 8–006245 (Jan. 1996).
Abstract of JP 6–301208 (Oct. 1994).
Abstract of JP 6–295061 (Oct. 1994).
Abstract of EP 619520 (Oct. 1994).
Abstract of JP 6–075373 (Mar. 1994).
Abstract of JP 6–075372 (Mar. 1994).
Abstract of JP 4–164902 (Jun. 1992).
Database WPI, Derwent Publications, AN–94 002558, JP–A–05 313 009, Nov. 26, 1993.

*Primary Examiner*—John A. McPherson
*Attorney, Agent, or Firm*—Oblon, Spivak, McClelland, Maier & Neustadt, P.C.

[57] ABSTRACT

A photopolymerizable composition for a color filter, which comprises a compound having at least one ethylenically unsaturated double bond, a photopolymerization initiator, and a red, green or blue colorant and which, when formed into a coating film having a dried film thickness of at most 1 $\mu$m, has an optical density of at least 1.1.

14 Claims, 1 Drawing Sheet

PHOTOPOLYMERIZABLE COMPOSITION FOR A COLOR FILTER

The present invention relates to a photopolymerizable composition for a color filter, which is useful for producing an optical color filter to be used for color televisions, liquid crystal display devices and cameras. Particularly, it relates to a photopolymerizable composition for a color filter, which has high sensitivity and excellent development properties. Further, the present invention relates to a black matrix for a color filter of a high quality, which has a high optical density and thus is excellent in the light shielding property and also excellent in the durability and antifouling property against impurities.

A color filter is usually prepared by forming stripe or mosaic color patterns of three different colors of red, green and blue with a width of from 10 to 50 μm in a precision of a few micrometer on the surface of a transparent substrate made of e.g. a glass or plastic sheet provided with a black matrix.

Typical methods for preparing color filters include, for example, a dying method, a printing method, a pigment dispersing method and an electro deposition method. Among them, a pigment dispersing method is particularly widely employed, since precision in positioning color filter picture elements and in the film thickness, is high, and the obtained color filter has a long useful life and little defects such as pinholes. The pigment dispersing method is a method wherein a color filter image is formed by repeating a series of steps comprising coating a photopolymerizable composition containing a colorant on a transparent substrate provided with a black matrix, followed by image exposure, development and heat curing.

The photopolymerizable composition used in such a pigment dispersing method usually contains, in addition to the colorant, an organic polymer substance, a compound having at least one ethylenically unsaturated double bond, a photopolymerization initiating system and a solvent.

As the photopolymerization initiation system, the one in which a triazine type compound, or a combination of a triazine type compound and an imidazole type compound, is used (Japanese Unexamined Patent Publication No. 201913/1994) the one wherein a Michler's ketone and an imidazole type compound are used in combination (Japanese Unexamined Patent Publication No. 173320/1993), or a dialkylacetophenone type, benzyldialkylketal type, benzoin type, benzoin alkyl ether type or thioxanthate derivative, as disclosed in "Fine Chemical", issued on Mar. 1, 1991, Vol. 20, No. 4, P. 16–26, is, for example, employed for a color filter (Japanese Unexamined Patent Publication Nos. 190362/1992, No. 303012/1993 and No. 35188/1994).

The black matrix is usually required to have a light shielding property of such a level that the optical density is at least 2.5. Further, when red, green and blue patterns are formed on the black matrix, and a transparent electrode of e.g. ITO is formed thereon, if protuberance of the black matrix portions is high, the electrode is likely to break at the stepped portions. Accordingly, the black matrix is required to fulfill the above optical density with a film thickness as thin as possible.

Further, at the time of forming colorant picture elements after forming the black matrix pattern, treatments such as cleaning, spin coating, development and heat treatment are applied. Accordingly, the black matrix is required to have adequate heat resistance, solvent resistance, developer resistance and adhesion, for such treatments. Further, the black matrix is required to have excellent durability when exposed to a high temperature and high vacuum during the ITO film forming operation. Furthermore, it is required that the content of low molecular weight impurities or volatile components is small so as to avoid a trouble such that impurities elute at the liquid crystal portion when formed into a module, so that the liquid crystal will be inoperable.

Heretofore, as a method for satisfying such required properties, a method of forming a black matrix by forming a chromium film on a substrate, followed by etching, has been most common. However, the black matrix made of such a chromium film has had a problem that it is expensive, the surface reflectance is high, and its disposal is under restriction. Then, a black matrix having a double layer structure having chromium laminated on chromium oxide, has been proposed. With this black matrix, the surface reflectance can be reduced, but the problems that it is expensive and its disposal is under restriction, have not been solved.

On the other hand, a black matrix prepared by a resist method employing a pollution-free black pigment such as carbon black has been proposed, and by the resist method, an inexpensive black matrix can be presented.

However, the black matrix prepared by the conventional resist method is inadequate in its light shielding property, and the film thickness is required to be at least 1.5 μm in order to attain the optical density of 2.5, whereby the above mentioned problem of stepped portions will result. In order to increase the light shielding property, it is conceivable to increase the weight ratio of the black pigment in the resist. In such a case, there have been practical problems that the function as the resist tends to be lost, and the polymerization degree of the photopolymerizable compound tends to be inadequate, whereby not only it will be difficult to obtain the above-mentioned heat resistance, solvent resistance, developer resistance and adhesion required for the resist film, but also impurities and volatile components tend to increase.

The current photopolymerizable composition for a color filter contains about 30 wt % of a colorant. In order to improve the optical density of the red, green or blue filter, or in order to improve the light shielding property of the black matrix, it is desired to attain the colorant content of at least 30% with a thin film of about 1 μm, whereby there will be a problem such that the light for exposure will be shielded by this colorant, thus leading to deterioration of the sensitivity and/or deterioration of the development property. Therefore, except for an imidazole type photopolymerization initiator, conventional photopolymerization initiators are inadequate in the sensitivity, and it takes a long time for exposure. On the other hand, the imidazole type initiator has had a problem that a developing failure is likely to result such that the colorant will remain also at a non-exposed portion at the time of development.

It is an object of the present invention to solve the above-mentioned conventional problems and to provide a photopolymerizable composition for a color filter which has high sensitivity and is excellent in the development property and the storage stability.

Another object of the present invention is to provide a photopolymerizable composition for a color filter useful for forming color filter picture elements having excellent solvent resistance.

A further object of the preset invention is to provide a black matrix for a color filter which is prepared by an inexpensive resist method and which has practically adequate light shielding property, heat resistance, chemical resistance, moisture resistance and adhesion and contains an adequately small amount of impurities or volatile components.

In a first aspect, the present invention provides a photopolymerizable composition for a color filter, which comprises a compound having at least one ethylenically unsaturated double bond, a photopolymerization initiator, and a red, green or blue colorant and which, when formed into a coating film having a dried film thickness of at most 1 μm, has an optical density of at least 1.1.

In a second aspect, the present invention provides a photopolymerizable composition for a color filter, which comprises a compound having at least one ethylenically unsaturated double bond, a photopolymerization initiator and a black colorant, and which, when formed into a coating film having a dried thickness of at most 1 μm, has an optical density of at least 2.5. This composition is useful for forming a black color matrix. When the composition is formed into a coating film having a dried thickness of at most 1 μm, the optical density of the coating film is preferably at least 2.8, and the reduction in the optical density after heat treatment at 230° C. for one hour is preferably at most 5%. Likewise, the reduction in the optical density after immersing the coating film in N-methylpyrrolidone at 25° C. for 5 minutes, is preferably at most 5%. Further, when the coating film is subjected to a pressure cooker test at 100° C. under 3 atm at a relative humidity of 100% for 3 hours, and then the adhesion is evaluated by a cross cut tape method and/or a X-cut tape method in accordance with JIS K 5400, the evaluation score is preferably at least 8 points. Further, the volatile component detected as measured up to 230° C. by thermal expulsion gas chromatography, is preferably at most 1.0%. The composition preferably contains at least 40 wt %, as a solid content concentration of carbon black as the colorant.

In a third aspect, the present invention provides a photopolymerizable composition for a color filter, which comprises a compound having at least one ethylenically unsaturated double bond, a titanocene compound and a colorant. This composition may further contain an alkylamino compound, a hexaarylbiimidazole compound, and/or an aromatic mercapto compound, as a photopolymerization initiator.

In the accompanying drawing, FIG. 1 is a cross sectional view showing the manner for measuring the tape peeling strength of the substrate, wherein reference numeral 1 indicates a substrate, numeral 2 a fixing table, numeral 3 a tape and numeral 3A a surface of substrate.

Now, the present invention will be described in detail with reference to the preferred embodiments.

The photopolymerizable composition for a color filter of the present invention comprises a compound having at least one ethylenically unsaturated bond, a photopolymerization initiator and a colorant as essential components. It may a further contain an organic polymer material, as a binder to improve the compatibility, the film-forming property, the development property and the adhesion. Specific examples of the organic polymer material to be used in the present invention, include an alkyl ester of (meth)acrylic acid such as methyl (meth)acrylate, ethyl (meth)acrylate, propyl (meth)acrylate, butyl (meth)acrylate, 2-ethylhexyl (meth)acrylate, hydroxyethyl (meth)acrylate, hydroxypropyl (meth)acrylate, or benzyl (meth)acrylate; a phenyl ester which may have a substituent of (meth)acrylic acid, such as hydroxyphenyl (meth)acrylate or methoxyphenyl (meth)acrylate; acrylonitrile; a vinyl ester of an acid, such as vinyl acetate, vinyl versatate, vinyl propionate, vinyl cinmamate, or vinyl pivalate; a copolymer of styrene or α-methyl styrene, a polyether of epichlorohydrin with bisphenol A, soluble nylon, polyvinyl alkyl ether, polyamide, polyurethane, polyethyleneterephthalate isophthalate, acetylcellulose, polyvinyl formal, and polyvinyl butyral. In this specification, "(meth)acryl" means "acryl or methacryl". The same applies to "(meth)acrylate".

In the present invention, for the purpose of improving the film strength, the coating solvent resistance or the adhesion to the substrate, of the resulting coating film, some or all of carboxyl groups of polymer materials having such carboxyl groups, among the above-mentioned organic polymer materials, are reacted with glycidyl (meth)acrylate or an epoxy (meth)acrylate of the following formula (T-1) or (T-2) to obtain photopolymerizable organic polymer materials.

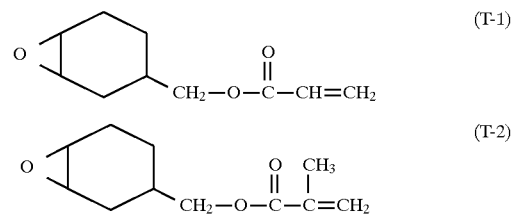

In the present invention, for the purpose of increasing the adhesion to the substrate, a particularly preferred organic polymer material may, for example, be a copolymer comprising from 10 to 80 mol %, preferably from 20 to 70 mol %, more preferably from 30 to 60 mol %, of a copolymerizable monomer having a phenyl group, such as styrene, a-methyl styrene, benzyl (meth)acrylate, hydroxyphenyl (meth)acrylate, methoxyphenyl (meth)acrylate, hydroxyphenyl (meth)acrylamide or hydroxyphenyl (meth)acrylsulfoamide and from 2 to 50 wt %, preferably from 5 to 40 wt %, more preferably from 5 to 30 wt %, of (meth)acrylic acid, or a reaction product having from 2 to 50 mol %, preferably from 5 to 40 mol %, more preferably from 10 to 30 mol %, based on the total copolymerizable monomers, of epoxy (meth)acrylate added.

With respect to the molecular weight of such an organic polymer material, the weight average molecular weight (Mw) is usually within a range of from 1,000 to 1,000,000, preferably from 2,000 to 500,000, more preferably from 3,000 to 200,000. If Mw of the organic polymer material is substantially lower than this range, the film deficiency will result at the image portion during development, and on the other hand, if Mw of the organic polymer material is substantially high, removal failure will result at the non-image portion during development.

The compound having at least one ethylenically unsaturated double bond (hereinafter referred to as "an ethylenic compound") is a compound, the polymerization reaction of which is initiated by radicals generated from a photopolymerization initiating system as described hereinafter. The ethylenic compound may be a monomer or a polymer having an ethylenically unsaturated double bond in its side or main chain. In the present invention, the monomer is meant for a substance as opposed to a so-called polymer material. Accordingly, it includes, not only a monomer in a narrow sense, but also a dimer, a trimer and an oligomer.

The ethylenic compound may, for example, be an unsaturated carboxylic acid, an ester of an aliphatic polyhydroxy compound with an unsaturated carboxylic acid, an ester of an aromatic polyhydroxy compound with an unsaturated carboxylic acid, or an ester obtained by an esterification reaction of an unsaturated carboxylic acid and a polybasic carboxylic acid with a polyhydric hydroxy compound such as an aliphatic polyhydroxy compound or an aromatic polyhydroxy compound.

Among them, the ester of an aliphatic polyhydroxy compound with an unsaturated carboxylic acid may, for example, be an acrylic acid ester such as ethylene glycol diacrylate, triethylene glycol diacrylate, trimethylol propane triacrylate, trimethylol ethane triacrylate, pentaerythritol diacrylate, pentaerythritol triacrylate, pentaerythritol tetracrylate, dipentaerythritol tetraacrylate, dipentaerythritol pentacrylate, dipentaerythritol hexaacrylate or glycerol acrylate, a methacrylic acid ester having acrylate of such a compound substituted by methacrylate, an itaconic acid ester likewise substituted by itaconate, a crotonic acid ester likewise substituted by crotonate, or a maleic acid ester likewise substituted by maleate.

The ester of an aromatic polyhydroxy compound with an unsaturated carboxylic acid may, for example, be hydroquinone diacrylate, hydroquinone dimethacrylate, resorcinol diacrylate, resorcinol dimethacrylate or pyrogallol triacrylate.

The ester obtained by an esterification reaction of an unsaturated carboxylic acid and a polybasic carboxylic acid with a polyhydric hydroxy compound, may not necessarily be a single substance. Typical examples include a condensation product of acrylic acid, phthalic acid and ethylene glycol, a condensation product of acrylic acid, maleic acid and ethylene glycol, a condensation product of methacrylic acid, terephthalic acid and pentaerythritol, and a condensation product of acrylic acid, adipic acid, butanediol and glycerol.

As other examples of the ethylenic compound to be used in the present invention, acrylamides such as ethylene bisacryloamide; allyl esters such as diallyl phthalic acid; and vinyl group-containing compounds such as vinyl phthalate, are also useful.

The above-mentioned polymer having an ethylenically unsaturated bond on its main chain may, for example, be a polyester obtained by a polycondensation reaction of an unsaturated dibasic carboxylic acid with a dihydroxy compound, or a polyamide obtained by a polycondensation reaction of an unsaturated dibasic carboxylic acid with a diamine.

The polymer having an ethylenically unsaturated bond on its side chain may, for example, be a condensation polymer of a dibasic carboxylic acid having an unsaturated bond on its side chain, such as itaconic acid, propylidene succinic acid or ethylidene malonic acid, with a dihydroxy or diamine compound. Further, a polymer having a reactive functional group such as a hydroxy group or a halogenated methyl group on its side chain, such as a polymer obtained by a polymer reaction of e.g. polyvinyl alcohol, poly(2-hydroxyethyl methacrylate) or polyepichlorohydrin with an unsaturated carboxylic acid such as acrylic acid, methacrylic acid or crotonic acid, may also suitably be used.

Among the above-mentioned ethylenic compounds, a monomer of an acrylic acid ester or a methacrylic acid ester is particularly suitable for use in the present invention.

The photopolymerization initiating system is not particularly limited so long as it contains a titanocene compound. It is possible to use titanocene compounds disclosed in e.g. Japanese Unexamined Patent Publications No. 152396/1984, No. 151197/186, No. 10602/1988, No. 41484/1988, No. 291/1990, No. 12403/1991, No. 20293/1991, No. 27393/1991, No. 52050/1991, No. 221958/1992, No. 219756/1992 and No. 27393/1991. Specifically, di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrr-1-yl)-phen-1-yl, may, for example, be mentioned.

Further, for the purpose of improving the sensitivity or letting lights of wavelengths of the light source for exposure be absorbed efficiently, it is preferred to incorporate a sensitizing dye (sensitizer) to the photopolymerization initiating system. In such a case, sensitizers effective for titanocene compounds to be used in the present invention, include, for example, coumarin compounds having a heterocyclic ring, as disclosed in Japanese Unexamined Patent Publications No. 239703/1991 and No. 289335/1993, 3-ketocumarin compounds as disclosed in Japanese Unexamined Patent Publication No. 221110/1988, xanthane dyes as disclosed in Japanese Unexamined Patent Publications No. 221958/1992 and No. 219756/1992, pyrromethene dyes as disclosed in Japanese Unexamined Patent Publication No. 19240/1994 and (p-dialkylaminobenzylidene) ketones, and styryl type dyes as disclosed in Japanese Unexamined Patent Publications No. 2528/1972, No. 155292/1979, No. 166154/1981 and No. 56403/1984, and sensitizing dyes having a julolidyl group as disclosed in Japanese Patent Application No. 83588/1993.

Specifically, the following dyes (1) to (17) may be mentioned.

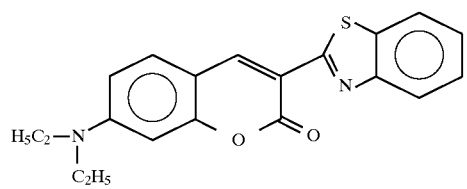

(1)

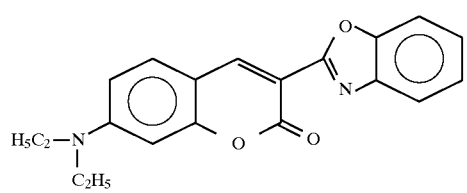

(2)

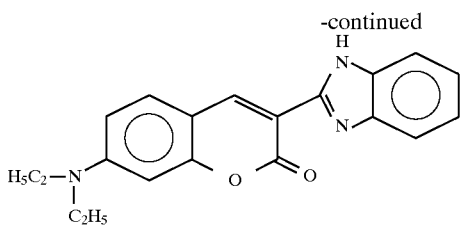
(3)
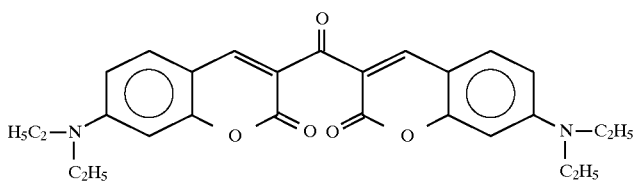
(4)
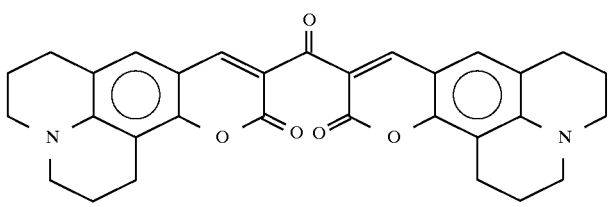
(5)
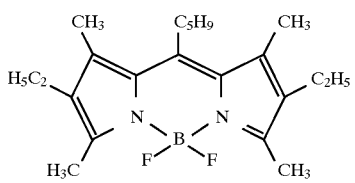
(6)
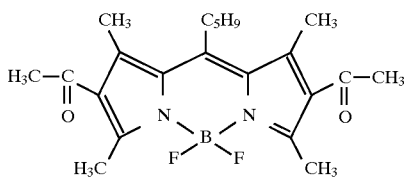
(7)
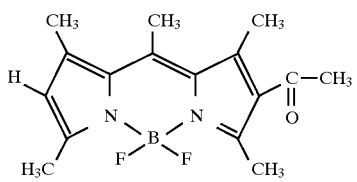
(8)
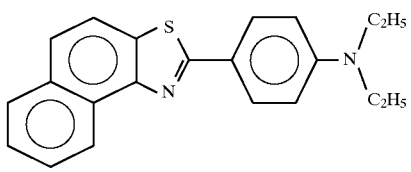
(9)
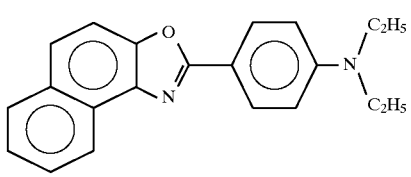
(10)
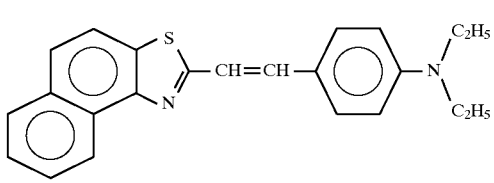
(11)

Ethyl eosine Y (12)
Ethylerythrosine (13)
Ethyl rosebengal (14)
Eosine Y (15)
Erythrosine (16)
Rosebengal (17)
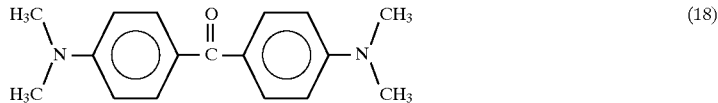
(18)
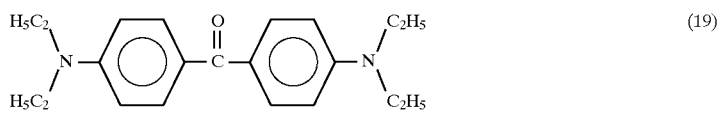
(19)
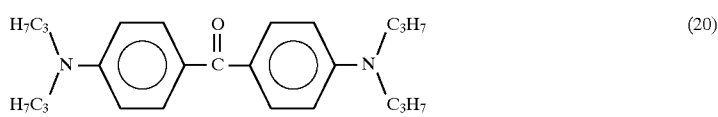
(20)
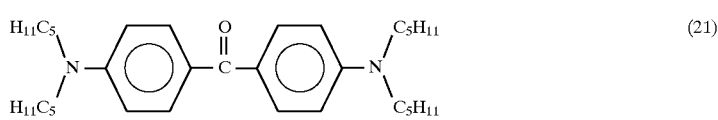
(21)
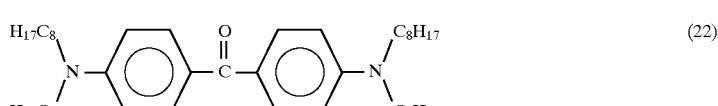
(22)
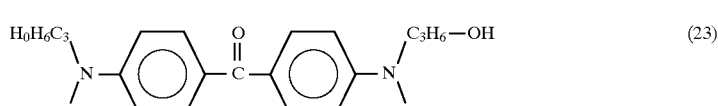
(23)
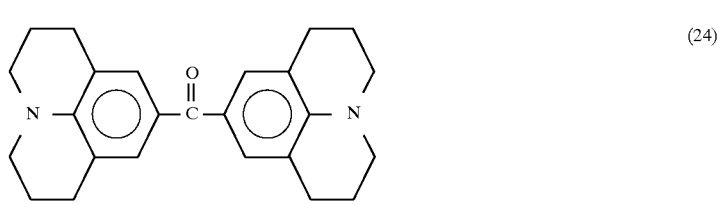
(24)
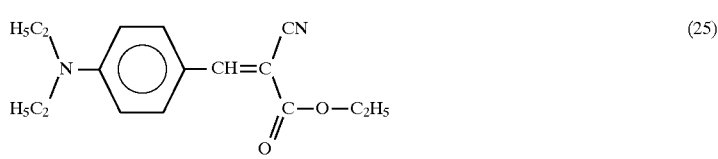
(25)
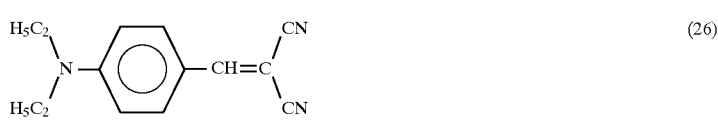
(26)
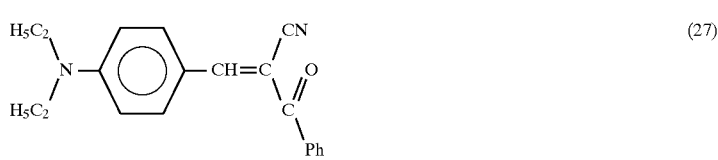
(27)

-continued

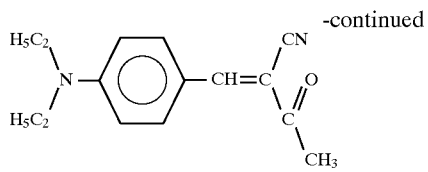 (28)

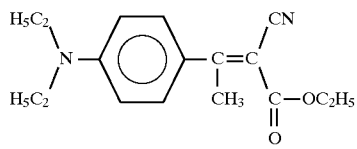 (29)

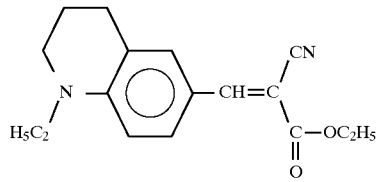 (30)

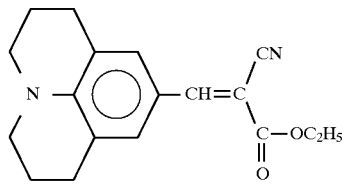 (31)

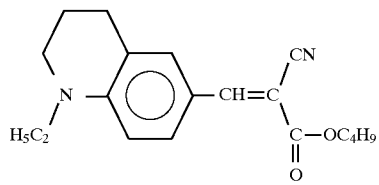 (32)

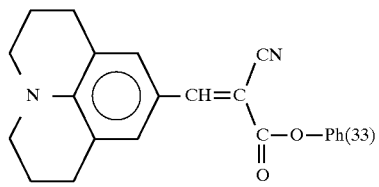 (33)

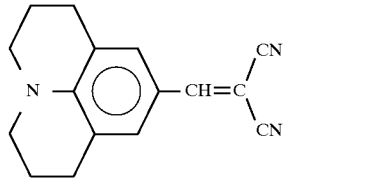 (34)

To the photopolymerization initiating system of the present invention, it is preferred to further incorporate an alkylamino compound and/or a hexaarylbiimidazole compound to improve the sensitivity.

The alkylamino compound may, for example, be a compound having a dialkylamine phenyl group or an alkylamine compound as disclosed in Japanese Unexamined Patent Publication No. 19240/1994 or No. 19249/1994. Specifically, the compound having a dialkylamino phenyl group may, for example, be a compound such as ethyl p-diethylamino benzoate or michler's ketone, or a dialkylamino phenylcarboaldehyde such as p-diethylaminobenzcarboaldehyde or 7-julolidylcarboaldehyde, and the alkylamine compound may, for example, be triethanolamine, diethanolamine or triethylamine. Among them a compound having a dialkylamino phenyl group is preferred, since it provides higher sensitivity.

On the other hand, specific examples of the hexaarylbiimidazole compound include 2,2'-bis(o-chlorophenyl)-4,4', 5,5'-tetraphenyldiimidazole, 2,2'bis(o-chlorophenyl)-4,4',5, 5'-tetra(p-carboethoxyphenyl)biimidazole, 2,2'-bis-(o-chlorophenyl)-4,4',5,5'-tetra(p-bromophenyl)biimidazole, 2,2'-bis(o-chlorophenyl)-4,4'-5,5-tetra(o,p-dichlorophenyl) biimidazole, 2,2'-bis(o-bromophenyl)-4,4',5,5'-tetraphenylbiimidazole, 2,2'-bis(o,p-dichlorophenyl)-4,4',5, 5'-tetraphenylbiimidazole, 2,2'bis(o-chlorophenyl)-4,4',5,5'-tetra(m-nethoxyphenyl)biimidazole, 2,2'-bis(o,p-dichlorophenyl)-4,4',5,5'-tetraphenylbiimidazole, 2,2'-bis(o-nitrophenyl)-4,4',5,5'-tetraphenylbiimidazole, and 2,2'-bis (o-methylphenyl)-4,4',5,5'-tetraphenylbiimidazole.

Further, it is possible to improve the sensitivity and the adhesion to the substrate by further incorporating an aromatic mercapto compound to the photopolymerization initiator system of the present invention. As such an aromatic mercapto compound, 2-mercaptobenzthiazole, 2-mercaptobenzoxazole, 2-mercaptobenzoimidazole, 2-mercaptonaphththiazole, 2-mercaptonathtoxazole or 2-mercaptonaphthimidazole as disclosed in Japanese Unexamined Patent Publication No. 56403/1984, may, for example, be mentioned.

The colorants are usually colorants of red, green and blue colors. When a black matrix is formed by the photopolymerizable composition, a black colorant will also be included.

Here, as the colorants, the above-mentioned three or four color dyes and pigments, or depending upon the particularly application, metal powders, white pigments, fluorescent pigments, etc. may also be used.

Specific examples of such dyes and pigments include Victoria Pure Blue (42595), Auramine O (41000), Carotene Brilliant Flavin (basic 13), Rhodamine 6GCP (45160), Rhodamine B (45170), Safranine OK 70:100 (50240), Erioglaucine X (42080), No. 120/Lionol Yellow (21090), Lionol Yellow GRO (21090), Benzine Yellow 4T-564D (21095), Lionol Red 7B4401 (15850), Lionol Blue SM (26150), Mitsubishi Carbon Black MA100, Mitusbishi Carbon Black #40, Lionol Blue ES (Pigment Blue 15:6), Lionogen Red GD (Pigment Red 168), and Lionol Green 2YS (Pigment Green 36). (The numerals in the above brackets ( ) represent color indices (C.I.).)

Further, other pigments may be identified by C.I. numbers. For example, C.I. yellow pigments 20, 24, 86, 93, 109, 110, 117, 125, 137, 138, 147, 148, 153, 154 and 166, C.I. orange pigments 36, 43, 51, 55, 59 and 61, C.I. red pigments 9, 97, 122, 123, 149, 168, 177, 180, 192, 215, 216, 217, 220, 223, 224, 226, 227, 228 and 240, C.I. violet pigments 19, 23, 29, 30, 37, 40 and 50, C.I. blue pigments 15, 15:1, 15:4, 22, 60 and 64, C.I. green pigment 7 and C.I. brown pigments 23, 25 and 26, may be mentioned.

The amount of the above organic polymer material to be incorporated to the photopolymerizable composition for a color filter is preferably from 10 to 80 wt %, particularly from 20 to 60 wt %, based on the total amount of the solid content other than the colorant.

The amount of the ethylenic compound is preferably from 20 to 90 wt %, particularly from 30 to 80 wt %, based on the total amount of the solid content other than the colorant.

Further, the amount of the photopolymerization initiating system to be incorporated is preferably from 0.1 to 40 wt %, more preferably from 0.5 to 30 wt %, most preferably from 0.5 to 20 wt %, based on the total amount of the solid content other than the colorant.

The weight ratios of the alkylamino compound and the sensitizing dye in this photopolymerization initiating system are such that to 10 parts by weight of the titanocene compound, the alkylamino compound is within a range of from 0 to 100 parts by weight, particularly from 20 to 50 parts by weight, the hexaarylbiimidazole compound is within a range of from 0 to 100 parts by weight, particularly from 10 to 50 parts by weight, the aromatic mercapto compound is within a range of from 0 to 100 parts by weight, particularly from 20 to 50 parts by weight, and the sensitizing dye is within a range of from 0 to 100 parts by weight, particularly from 0 to 50 parts by weight.

In the case of a red, green or blue colorant, such a colorant is incorporated so that when the coating film is formed in a thickness of at most 1 $\mu$m, the optical density will be at least 1.1, preferably at least 1.3, to improve the light transmittance of the colorant layer. In the case of the black colorant, it is incorporated so that when the coating film is formed in a thickness of at most 1 $\mu$m, the optical density will be at least 25, preferably at least 3.0, more preferably at least 3.5, to increase the light shielding property.

Specifically, the colorant is preferably incorporated in an amount within a range of from 20 to 80 wt %, particularly from 30 to 70 wt %, based on the total solid content in the photopolymerizable composition.

In the present invention, the solvent is the one which dissolves or disperses the above-mentioned various components. Specifically, it may, for example, be methylcellosolve, ethylcellosolve, butylcellosolve, diethylene glycol monomethyl ether, propylene glycol monomethyl ether acetate, (hereinafter referred to simply as "PGMEA"), methyl ethyl ketone, methyl isobutyl ketone, cyclohexanone, toluene, chloroform, dichloromethane, ethyl acetate, methyl lactate, ethyl lactate, methanol, ethanol, propanol, butanol or tetrahydrofuran.

The photopolymerizable composition of the present invention is adjusted by means of such a solvent so that the solid content concentration will be within a range of from 5 to 50 wt %, preferably from 10 to 30 wt %.

The composition of the present invention will now be described specifically with respect to a photosensitive resist to be used for forming a black matrix for a color filter (hereinafter referred to as "a black resist"). The black resist comprises a black dye or pigment, a dispersant, a photopolymerization initiating system which produces radicals on absorption of lights and an addition polymerizable ethylenic compound, the polymerization of which is initiated by the radicals. Further, it preferably contains an organic polymer material as a binder to improve the properties of the photopolymerizable layer, such as the compatibility, the film-forming property, the development property and the adhesion.

As the black pigment, carbon black is preferred, and any carbon black may be used so long as it is dispersible in the organic solvent which will be described hereinafter. Further, if necessary, together with carbon black, other black dyes or pigments, such as titanium black, iron oxide type black pigment or aniline black may be used for adjusting the color.

Specific examples of carbon black include #5, #10, #20, #25, #30, #32, #33, #40, #44, #45, #45L, #47, #50, #52, #55, MA600, #650, #750, MCF88, #850, #900, #950, #960, #970, #980, #990, #1000, #2200, #2300, #2350, #2400, #2600, #2650, #2700, MA7, MA8, MA11, MA1100, MA100R, MA220 and MA 230, manufactured by Mitsubishi Chemical Corporation, MTC, FTC and FTC#15, manufactured by Asahi Carbon K.K., FW series and Printex series, manufactured by Degusa Co., Ltd.

Other specific examples of the black dyes or pigments include aniline black D and black #300, manufactured by Noma Kagaku K.K., Titan Black 13M·13R·10S, manufactured by Mitusbishi Material K.K., and Black RLI, manufactured by Ciba Geigy.

The black matrix of the present invention has a high shielding property with an optical density of at least 2.8 in a film thickness of at most 1.0 $\mu$m, and it preferably contains from 40 to 90 wt %, more preferably from 50 to 70 wt %, of a black dye or pigment in the black matrix. It is particularly preferred that it contains at least 40 wt % of carbon black as the black colorant. Accordingly, in the black resist, the black dye or pigment is incorporated to satisfy these conditions without creating any problem in the dispersibility. Usually, the content of the black dye or pigment in the black matrix is substantially the same as the content in the solid content of the black resist. Accordingly, the proportion of the black dye or pigment in the solid content may also be from 40 to 90 wt %, when it is incorporated to the black resist.

The dispersant may be any dispersant so long as the above black pigment can thereby be effectively dispersed in an organic solvent such as PGMEA, ethyl cellosolve acetate (hereinafter referred to simply as "ECA") or cyclohexanone, and it may be a surfactant, a low molecular weight dispersant or a high molecular weight dispersant. The surfactant may, for example, be an anionic surfactant. The low molecular weight dispersant may, for example, be the Solsperse series, manufactured by Zeneka K.K. or Disperbyk series, manufactured by Big Chemi. The high molecular weight dispersant may be a thermosetting resin or a thermoplastic resin. The thermosetting resin may, for example be a urethane type, an acrylic type, a polyimide type, an alkyd type, an epoxy type, an unsaturated polyester type, a melamine type or a phenol type, and the thermoplastic resin may, for example, be an acryl type, a vinyl chloride type, a vinyl chloride-vinyl acetate copolymer type, a urethane type, a polyamide type or a polycarbonate type.

The amount of such a dispersant may be an amount sufficient to disperse the black dye or pigment and is preferably from 1 to 100 wt %, relative to the black dye or pigment.

The photopolymerization initiating system may, for example, be a titanocene type, a biimidazole type, a benzothiazole type, a benzophenone type, a thioxantone type, a benzotriazole type or a salicylate type ultraviolet ray absorber. It is also possible to use them in a proper combination, as the case requires. Preferably, the titanocene type and the biimidazole type are mentioned, and more preferably their combination may be mentioned. Further, a photopolymerization accelerator may be used together, as the case requires. The photopolymerization accelerator may, for example, be KAYACURE EPA, manufactured by Nippon Kayaku K.K., or a benzoic acid derivative such as KAYACURE DMBI.

The ratio of such a photopolymerization initiating system to be incorporated is preferably such that the total amount of the photopolymerization initiator and the photopolymerization accelerator is from 1 to 50 wt %, relative to the ethylenic compound.

As the ethylenic compound, any ethylenic compound may be used so long as the polymerization can be initiated by the above photopolymerization initiating system. For example, a polyfunctional (meth)acrylate such as dipentaerythritol hexa(meth)acrylate or trimethol propane tri(meth)acrylate, or a bisphenol derivative may be mentioned. Further, if necessary, two or more such ethylenic compounds may be used in combination.

The blend ratio of the ethylenic compound is preferably from 5 to 50 wt %, as the weight concentration in the solid content of the black resist.

Now, the preparation of the black resist of the present invention will be described. To prepare the black resist of the present invention, firstly the black dye or pigment and the dispersant are mixed to an organic solvent such as PGMEA, ECA or cyclohexanone or to a solvent mixture comprising two or more of them, so that the solid content concentration will be from 5 to 50 wt %, preferably from 10 to 30 wt %. To this mixed solution, beads for dispersion such as glass beads or zirconia beads are added in a proper amount, followed by dispersion of the black dye or pigment by means of a paint conditioner, a ball mill or a sand grinder. The beads to be used for this dispersing treatment may be those having a particle size of from 0.1 to 20 mm. For the dispersion of the black dye or pigment, a three roll mill, a homogenizer, a jet mill or supersonic wares may, for example, be employed without using beads.

To the dispersion of the black dye or pigment thus obtained, the ethylenic compound, the photopolymerization initiating system, an organic solvent such as PGMEA, ECA or cyclohexanone, or a solvent mixture comprising two or more of them, and if necessary, an organic polymer material as a binder, are added and mixed to obtain a black resist.

Now, a method for forming a black matrix on a transparent substrate by means of the black resist thus obtained, will be described.

As the transparent substrate, various glass sheets or plastic sheets of e.g. a polyester such as polyethylene terephthalate, or a polyolefin such as polypropylene or polyethylene, may be employed. To such a transparent substrate, corona discharge treatment, ozone treatment or treatment forming a thin film of various polymers such as a silane coupling agent or an urethane polymer, may be applied, as the case requires, in order to improve the physical properties such as the adhesive property of the surface.

The thickness of the transparent substrate is preferably within a range of from 0.05 to 10 mm, particularly from 0.1 to 7 mm.

To prepare the black matrix, firstly the above-mentioned black resist is coated and dried to form a film of a uniform thickness on the above transparent substrate by a coating method such as spin coating. The thickness of the coating film is preferably at most 1.0 $\mu$m as the film thickness after drying. Further, non-uniformity in the film thickness (the difference between the maximum film thickness and the minimum film thickness) is preferably at most 0.1 $\mu$m.

On this black resist film, an aqueous polyvinyl alcohol solution or the like may be coated, as the case requires, to form an oxygen-shielding film. In such a case, the film thickness of the oxygen-shielding film is preferably from 0.1 to 5 $\mu$m.

Then, using a mask having a black mask pattern formed thereon, contact exposure or proximity exposure is carried out. Here, the exposure is preferably from 10 to 10,000 mj/cm$^2$.

Then, if necessary, heat treatment is carried out, and development is carried out by means of a developer such as an aqueous alkaline solution to obtain a black matrix pattern, followed by heat treatment or ultraviolet ray treatment to completely cure the resist film, to obtain the black matrix of the present invention having various properties improved. Here, the ultraviolet ray treatment may be carried out either from the resist side or from the substrate side, or from both sides.

It is preferred to employ the following treatment under the following conditions after the development in order to form a black matrix, wherein ① the reduction in the optical density after heat treatment at 230° C. for one hour is at most 5%, ② the reduction in the optical density after immersing in N-methylpyrrolidone at 25° C. for 5 minutes, is at most 5%, ③ when the adhesion is evaluated by a cross cut tape method and/or an X cut tape method in accordance with JIS K5400 after subjecting the black matrix to a pressure cooker test at 100° C. under 3 atm at a relative humidity of 100% for 3 hours, the evaluation score is at least 8 points, and ④ the volatile component detected when it is measured up to 230° C. in thermal expulsion gas chromatography, is at most 0.1%.

Namely, it is preferred to form a black matrix by irradiating ultraviolet rays of from 100 to 10,000 mj/cm² after the development, followed by heat treatment at a temperature of from 100° to 300° C. for from 1 to 30 minutes.

Now, a method for producing a color filter using the photopolymerizable composition for a color filter of the present invention, will be described.

Firstly, among the photopolymerizable compositions for a color filter containing the above-mentioned red, green and blue colorants, respectively, one composition for the first color is coated on a transparent substrate having a black matrix formed thereon, by means of a coating apparatus such as a wire bar, a flow coater, a die coater, a roll coater or a spray, and dried. Then, a photomask is placed on this sample, and through the photomask, image exposure, development and, if necessary, heat curing or photocuring, are carried out to form a colorant picture element image. This operation is repeated for the second color and the third color to form a color filter image having a thickness of from 0.5 to 3 μm on the transparent substrate.

The transparent substrate used here is a transparent substrate for a color filter, and its material is not particularly limited. However, it may, for example, be a plastic sheet of e.g. a polyester such as polyethylene terephthalate, or a polyolefin such as polypropylene or polyethylene, or various glass sheets. Particularly, a glass sheet is preferably employed from the viewpoint of the heat resistance.

To such a transparent substrate, corona discharge treatment, ozone treatment or a treatment for a thin film of various polymers such as a silane coupling agent or a urethane polymer, may preferably be applied to improve the physical properties such as the adhesive property of the surface.

The thickness of the transparent substrate is preferably within a range of from 0.05 to 10 mm, particularly from 0.1 to 7 mm. Further, a thin film of various polymers may be coated thereon. The film thickness is preferably within a range of from 0.01 to 10 μm, particularly from 0.05 to 5 μm.

The size of the transparent substrate is not particularly limited, but it is usual to employ a transparent substrate of a size of a few to a few tens cm×a few to few tens cm.

Further, it is preferred to form a thin film of e.g. chromium as a black matrix on the transparent substrate, followed by etching treatment. This black matrix can be prepared also by using a photopolymerizable composition for a color filter containing a black colorant, as mentioned above.

The power source to be used for exposure may, for example, be a lamp power source such as xenon lamp, halogen lamp, tungsten lamp, high pressure mercury lamp, metal halide lamp, medium pressure mercury lamp or low pressure mercury lamp, or a laser power source such as argon ion laser, YAG laser, exma laser or nitrogen laser. To use only a specific wavelength of irradiated lights, an optical filter may suitably be employed.

For the development treatment, it is preferred to use an alkali developer. For example, an aqueous solution containing an inorganic alkali agent such as sodium carbonate, potassium carbonate, sodium silicate, potassium silicate, sodium hydroxide or potassium hydroxide, or an organic alkali agent such as diethanol amine, triethanol amine or tetraalkylammonium hydroxide and if necessary, a surfactant, a water-soluble organic solvent or a lower molecular weight compound having a hydroxyl group or a carboxyl group, for the purpose of improving the image quality of shortening the time for development, may be employed.

The surfactant for the developer may, for example, be an anionic surfactant having a sodium naphthalene sulfonate group or a sodium benzene sulfonate group, a nonionic surfactant having a polyalkyleneoxy group, or a cationic surfactant having a tetraalkylammonium group. The water-soluble organic solvent may, for example, be ethanol, propyl alcohol, butanol, methylcellosolve, butylcellosolve, phenylcellosolve, ethylene glycol, diethylene glycol, triethylene glycol, tetraethylene glycol, propylene glycol, dipropylene glycol, tripropylene glycol, tetrapropylene glycol or propylene glycol monomethyl ether.

The low molecular weight compound having a hydroxyl group or a carboxyl group may, for example, be 1-naphthol, 2-naphthol, pyrogallol, benzoic acid, succinic acid or glutaric acid.

The developing treatment is conducted usually by dip development, spray development, brush development or supersonic development, at a developing temperature of from 20° to 40° C., preferably from 25° to 35° C.

The titanocene compound is highly sensitive and free from a problem such that the colorant remains at the time of development. Therefore, by using a titanocene compound as a photopolymerization initiating system, it is possible to obtain a photopolymerizable composition which is highly sensitive and excellent not only in the developing property but also in the storage stability.

By using an alkylamino compound and/or a hexaarylbiimidazole compound together with the titanocene compound, the sensitivity can further be improved. Further, by using an aromatic mercapto compound, the adhesion to the substrate and the sensitivity can be improved.

Now, the present invention will be described in further detail with reference to Examples and Comparative Examples. However, it should be understood that the present invention is by no means restricted to such specific Examples.

EXAMPLES 1 TO 9 AND COMPARATIVE EXAMPLES 1 TO 6

Using the following photopolymerization initiating systems I to VI in the indicated proportions and the following organic polymer materials ① to ⑨, in the combinations as identified in Table 2, and using dipentaerythritol hexaacrylate as the ethylenic compound, PGMEA as the coating solvent and the following red, green and blue colorants as the colorants, coating solutions of photopolymerizable compositions were prepared. The blend proportions other than for the photopolymerization initiating system were as shown in the following Table 1.

TABLE 1

| Blend proportions (parts by weight) | |
| --- | --- |
| Organic polymer material | 65 |
| Ethylenic compound | 35 |
| Coating solvent | 900 |
| Colorant | 30 |

Photopolymerization initiating systems
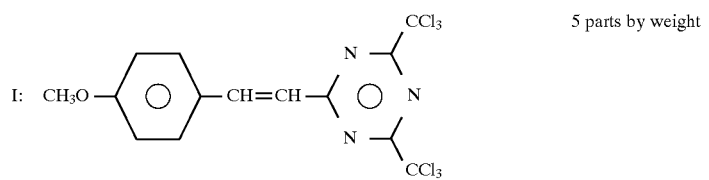    5 parts by weight
I:
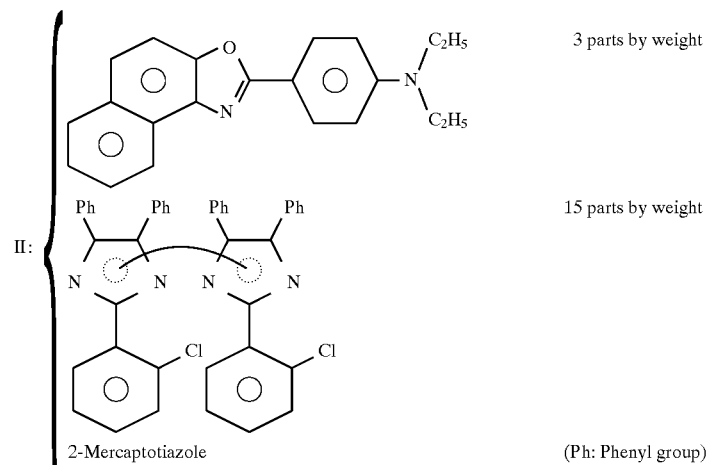
II:    3 parts by weight
15 parts by weight
2-Mercaptotiazole    (Ph: Phenyl group)
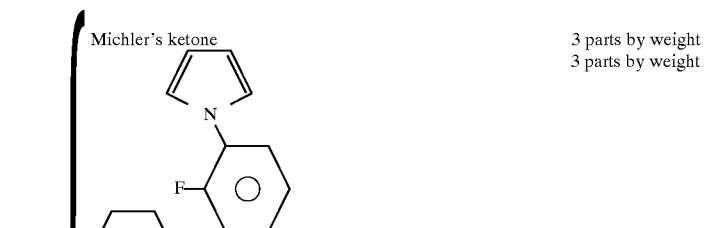
Michler's ketone    3 parts by weight
                    3 parts by weight
III:
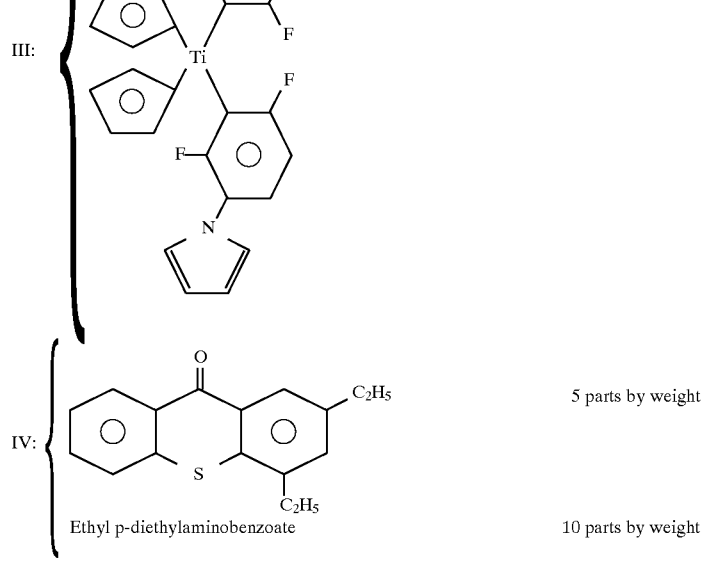    5 parts by weight
IV:
Ethyl p-diethylaminobenzoate    10 parts by weight

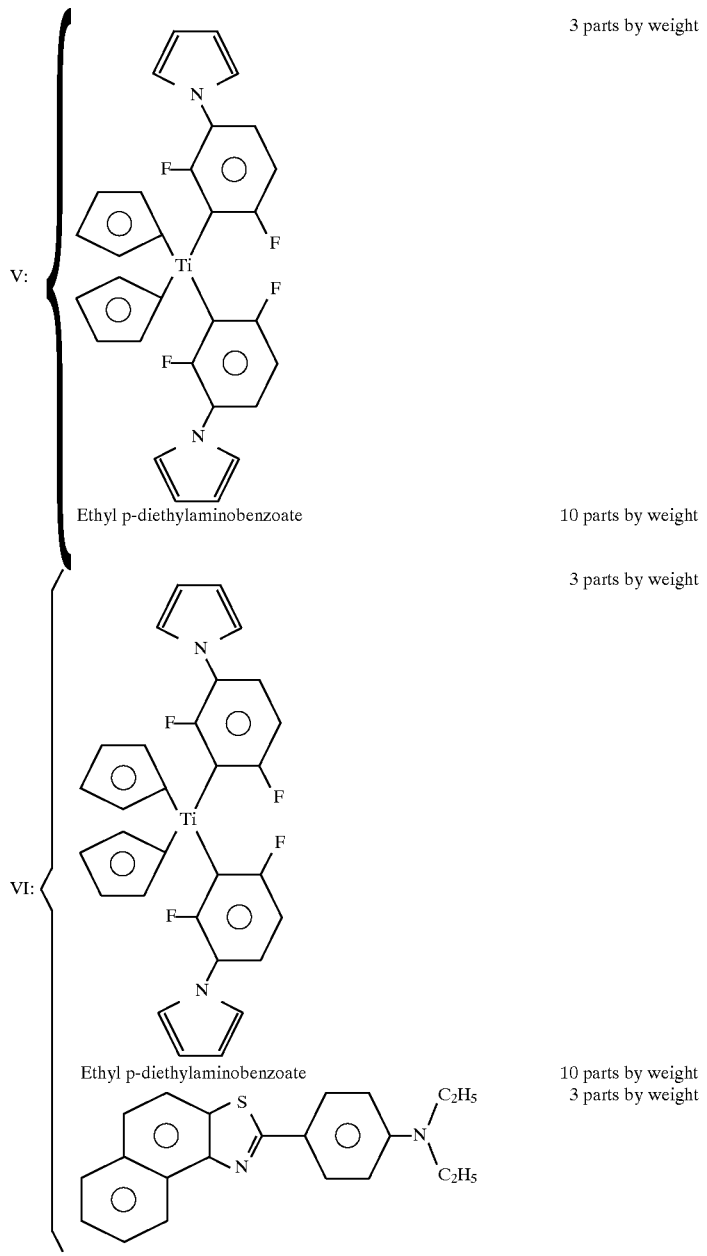
V: Ethyl p-diethylaminobenzoate — 3 parts by weight / 10 parts by weight
VI: Ethyl p-diethylaminobenzoate — 3 parts by weight / 10 parts by weight / 3 parts by weight
Organic polymer materials
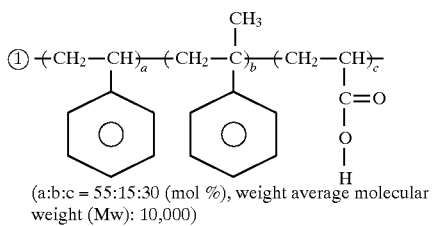
(a:b:c = 55:15:30 (mol %), weight average molecular weight (Mw): 10,000)

-continued
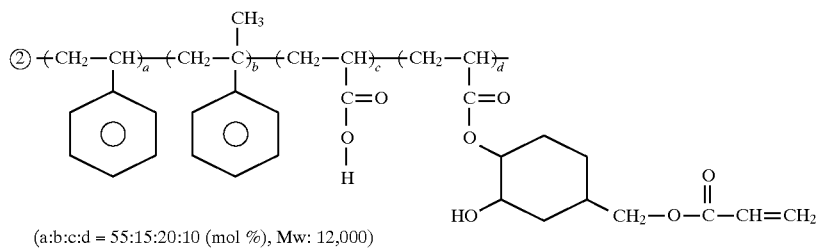
(a:b:c:d = 55:15:20:10 (mol %), Mw: 12,000)
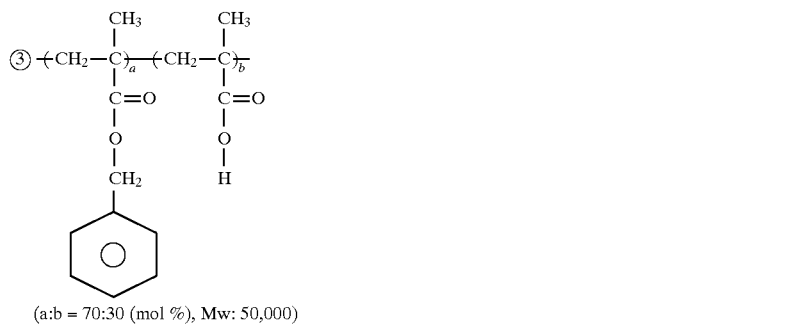
(a:b = 70:30 (mol %), Mw: 50,000)
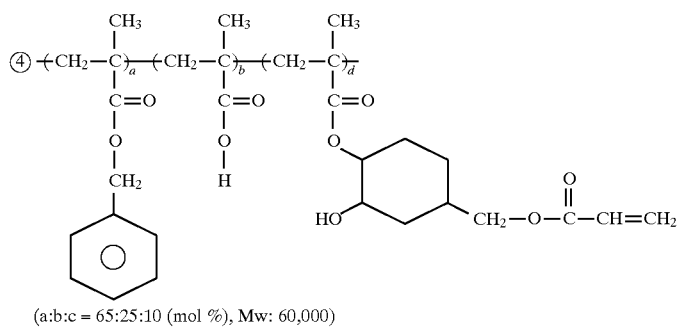
(a:b:c = 65:25:10 (mol %), Mw: 60,000)
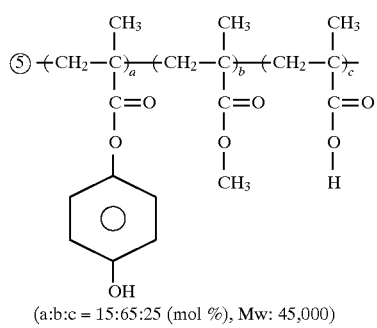
(a:b:c = 15:65:25 (mol %), Mw: 45,000)
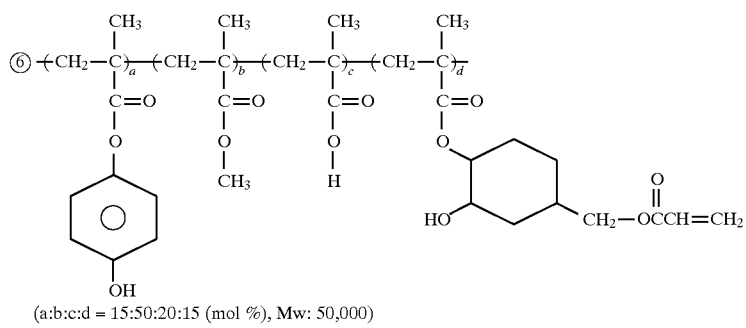
(a:b:c:d = 15:50:20:15 (mol %), Mw: 50,000)

-continued

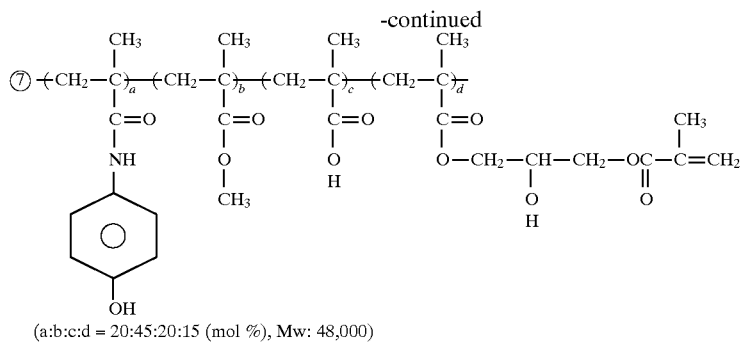
(a:b:c:d = 20:45:20:15 (mol %), Mw: 48,000)

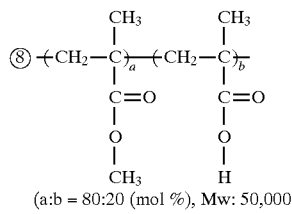
(a:b = 80:20 (mol %), Mw: 50,000)

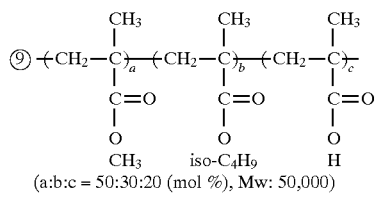
(a:b:c = 50:30:20 (mol %), Mw: 50,000)

Colorants
  Red: Lionogen Red GD (manufactured by Toyo Ink K.K.)
  Green: Lionol Green 2YS (manufactured by Toyo Ink K.K.)
  Blue: Lionol Blue ES (manufactured by Toyo Ink K.K.)

On a glass substrate (No.7059, manufactured by Corning Company), a chromium black matrix repeating with a pitch of 330 μm in a longitudinal direction and with a pitch of 330 μm in a transverse direction in a film thickness of 0.2 μm with a width of 30 μm, was formed in accordance with a usual method. Then, on this sample, the photopolymerizable composition containing the red colorant was coated by a wire bar coater so that the dried film thickness would be 1.5 μm and dried at 100° C. for 2 minutes to form a red photopolymerizable layer. Then, using a photomask, the layer was exposed with a proper exposure as identified in Table 2. Then, the sample was immersed in a developing solution containing 0.5 wt % of sodium carbonate and 1 wt % of an anionic surfactant (Pelex NBC, manufactured by Kao Corporation) at 25° C. for from 30 seconds to 3 minutes and wiped 5 times with a sponge for developing treatment and then subjected to heat treatment at 150° C. for 15 minutes to form a red colorant image in spaces of the black matrix.

Then, with respect to the photopolymerizable composition containing the green colorant and the photopolymerizable composition containing the blue colorant, the same operation as above was repeated to form the green and blue colorant images, respectively.

For the proper exposure, a Ugra test chart is placed on the colorant photopolymerizable layer, and exposure and development treatment were carried out while changing the exposure to the test chart, whereupon from the obtained colorant images of the test chart, the exposure when the line widths of the finest lines of the negative and positive fine line images in the test chart images become the same, is taken as the proper exposure.

From the color picture element images thus formed on the glass substrate, the development properties, the liquid storage stability and the adhesion to the substrate, of the colorant photopolymerizable compositions of the present invention, were evaluated by the following methods, and the results are shown in Table 2.

Liquid storage stability

The coating liquid of the above green photopolymerizable composition was stored, after a preparation, at 25° C. for 6 months and then coated on the glass substrate and dried in the same manner as described above. Then, using a ugra test chart, the image exposure was carried out with a proper exposure as measured with a fresh liquid, followed by development treatment to obtain ugra test chart colorant image (a). From reproducibility of fine line images of the colorant image (a), the stability of the green photopolymerizable composition with time (the liquid storage stability) was evaluated in accordance with the following standards.

A: Fine lines of 8 μm were reproduced in both positive and negative images.
B: From 8 to 15 μm of positive fine lines, and 8 μm of negative fine lines were reproduced.
C: From 15 to 25 μm of positive fine lines, and 8 μm of negative fine lines were reproduced.
D: The reproducibility of positive fine lines was at least 25 μm.

Development property

In the above step of forming a red picture element image for a color filter, a red photopolymerizable composition was coated and dried on a glass substrate having a chromium black matrix, and then using a photomask, exposure and development treatment were carried out, whereby the developing property of the non-exposed portion of the red photopolymerizable layer on the chromium black matrix which should have been dissolved and removed by the development, was inspected by a magnifier with 50 magnifications and evaluated from the red pigment remaining on the chromium black matrix in accordance with the following standards.

A: No red pigment remained on the chromium black matrix.

B: The red pigment remained at a portion corresponding to from 1 to 5% of the chromium black matrix.

C: The red pigment remained at a portion corresponding to from 5 to 20% of the chromium black matrix.

D: The red pigment remained at a portion corresponding to more than 20% of the chromium black matrix.

The adhesion to the substrate

On the color filter image obtained on a glass substrate, matrix-form cutting lines with a pitch of 2 mm were formed by means of a cutter, and an adhesive tape was bonded thereon, and peeling of the picture element image resulting at the time of peeling the adhesive tape was visually observed and evaluated in accordance with the following standards.

A: No peeling of the image from the glass substrate was observed by the adhesive tape peeling.

B: From 1 to 2% of the image was peeled by the adhesive tape peeling.

C: From 2 to 5% of the image was peeled by the adhesive tape peeling.

D: At least 5% of the image was peeled by the adhesive tape peeling.

of 2-mercaptobenzthiazole was further added to the polymerization initiating system, whereby the sensitivity of each of the red, green and blue resists was improved 1.5 times.

EXAMPLES 13 TO 25 AND COMPARATIVE EXAMPLES 7 TO 10

On a substrate identified in Table 3 or 4, a black photopolymerizable composition prepared to have the following composition using the blend materials as shown in Table 3 or 4, was coated by a wire bar coater so that the dried film thickness would be 0.8 $\mu$m, and dried at 100° C. for 2 minutes to form a black photopolymerizable layer. Then, on such a sample, an aqueous polyvinyl alcohol solution was coated by the same method as above so that the dried film thickness would be 2 $\mu$m and then dried. Then, using a ugra test chart, mask exposure was carried out at each exposure by a 2 kw high pressure mercury lamp. Then, the sample was immersed in a developing solution containing 0.5 wt % of triethanol amine and 1 wt % of an anion surfactant (Pelex NBL, manufactured by Kao Corporation) at 25° C. for 30 seconds and then rubbed five times with a sponge for developing treatment to form a colorant image. At that time, the exposure (the optimum sensitivity) when the line widths of the finest lines of positive and negative fine lines in the black image of the test chart formed on the sample, was determined, and the results are shown in Table 3 or 4.

Black photopolymerizable compositions

Photopolymerization initiating systems: as shown in Tables 3 and 4

TABLE 2

| Examples | Photopolymerization initiating system | Organic polymer material | Proper exposure (mj/cm²) Red | Green | Blue | Development property | Liquid storage stability | Adhesion to the substrate |
|---|---|---|---|---|---|---|---|---|
| Example 1 | III | ① | 200 | 200 | 200 | A | A | B |
| Example 2 | III | ② | 200 | 200 | 200 | A | A | A |
| Example 3 | III | ⑧ | 300 | 300 | 300 | A | A | D |
| Example 4 | III | ⑨ | 250 | 250 | 250 | A | A | D |
| Comparative Example 1 | I | ① | 800 | 800 | 800 | B | B | C |
| Comparative Example 2 | I | ② | 600 | 600 | 600 | B | C | B |
| Example 5 | III | ③ | 170 | 170 | 170 | A | A | B |
| Example 6 | V | ④ | 180 | 180 | 180 | A | A | A |
| Example 7 | VI | ⑤ | 150 | 150 | 150 | A | A | B |
| Example 8 | VI | ⑥ | 150 | 150 | 150 | A | A | A |
| Example 9 | VI | ⑦ | 160 | 160 | 160 | A | A | A |
| Comparative Example 3 | II | ① | 250 | 250 | 250 | D | D | B |
| Comparative Example 4 | II | ② | 250 | 250 | 250 | D | D | A |
| Comparative Example 5 | II | ⑨ | 300 | 300 | 300 | D | D | D |
| Comparative Example 6 | VI | ⑧ | 1500 | 1500 | 1500 | A | A | D |

EXAMPLE 10

The image formation was carried out in the same manner as in Example 1 except that in Example 1, 5 parts by weight of 2-mercaptobenzthiazole was further added to the polymerization initiating system, whereby the sensitivity of each of the red, green and blue resists was improved twice.

EXAMPLE 11

The image formation was carried out in the same manner as in Example 6 except that in Example 6, 5 parts by weight of 2-mercaptobenzthiazole was further added to the polymerization initiating system, whereby the sensitivity of each of the red, green and blue resists was improved 1.5 times.

EXAMPLE 12

The image formation was carried out in the same manner as in Example 9 except that in Example 9, 5 parts by weight The organic polymer materials: as shown in Tables 3 and 4

Ethylenic compounds: as shown in Tables 3 and 4

Black pigment (MA-7, manufactured by Mitsubishi Chemical Corporation): 100 parts by weight Coating solvent (PGMEA): 900 parts by weight Base 1 and Base 2 as the substrates shown in Tables 3 and 4 are as follows.

Base 1: A glass substrate (No. 7059, manufactured by Corning Company.) (Tape peeling strength: 208 g/cm)

Base 2: A substrate of a diazo-containing negative photosensitive lithographic printing plate obtained by peeling a photosensitive layer by a solution prepared by four times diluting a developing solution (SDN-21) for a negative photosensitive lithographic printing plate (tape peeling strength: 714 g/cm)

The tape peeling strength of the above substrate is determined in such a manner that on the surface of the substrate, a Scotch mending tape manufactured by Sumitomo 3M K.K. was press-bonded at 25° C. under 5 kg/cm² to 50 cm/min, whereupon as shown in FIG. 1, the substrate 1 was fixed on a fixing table 2, and the tape 3 was peeled at a rate of 8 cm/min in a direction of 180° from the substrate 1, whereby the tape peeling strength is represented by a linear tensile force obtained by diving the force F required for the peeling by the width of the tape.

Further, the materials used as the photopolymerization initiating systems, the ethylenic compounds and the organic polymer materials in Tables 3 and 4 are as follows.

---

Sensitizing dyes

| | | |
|---|---|---|
| Z-1: | Michler's ketone | 5 parts by weight |
| Z-2: | [structure: naphthoxazole-phenyl-N(C₂H₅)₂] | 5 parts by weight |
| Z-3: | [structure: 7-diethylamino-4-methylcoumarin] | 5 parts by weight |

Radical generating agents

| | | |
|---|---|---|
| R-1: | [structure: bis(2-chlorophenyl)-tetraphenylbiimidazole] | 5 parts by weight |
| R-2: | [structure: Ti titanocene with pyrrolyl and fluorophenyl ligands] | 5 parts by weight |
| R-3: | [structure: CH₃O-phenyl-CH=CH-triazine-(CCl₃)₂] | 5 parts by weight |

Alkylamino compound

| | | |
|---|---|---|
| DAA: | [structure: 4-(diethylamino)benzoic acid ethyl ester] | 5 parts by weight |

Aromatic mercapto compounds

| | | |
|---|---|---|
| M-1: | [structure: 2-mercaptobenzoxazole] | 5 parts by weight |
| M-2: | [structure: 2-mercaptobenzothiazole] | 5 parts by weight |
| M-3: | [structure: 2-mercaptobenzimidazole] | 5 parts by weight |

---

Ethylenic compounds

| | | |
|---|---|---|
| E-1: | Dipentaerythritol hexarylate (DPHA): | 20 parts by weight |
| | Epoxyacrylate (SP-1509, manufactured by Showa Kobunshi k.K.): | 20 parts by weight |
| E-2: | DPHA: | 20 parts by weight |
| | Epoxyacrylate (SP-2500, manufactured by Showa Kobunshi k.K.): | 20 parts by weight |

Organic polymer materials

O-1: [structure: -(CH₂-CH(Ph))-(CH₂-C(CH₃)(Ph))-(CH₂-CH(COOH))-]    60 parts by weight (a:b:c = 50:15:30 (mol %), weight average molecular weight (Mw): 10,000)

O-2: [structure: -(CH₂-C(CH₃)(COOCH₂Ph))-(CH₂-C(CH₃)(COOH))-]    60 parts by weight (a:b = 70:30 (mol %), (Mw): 50,000)

TABLE 3

| Examples | Substrate | Photopolymerization initiating system | | | | | | Proper sensitivity (mj/cm²) |
|---|---|---|---|---|---|---|---|---|
| | | Sensitizing dye | Radical generating agent | Alkylamino compound | Aromatic mercapto compound | Ethylenic compound | Organic polymer material | |
| Examples 13 | Base 1 | Z-1 | R-1 R-2 | DAA | M-1 | E-1 | O-2 | 85 |
| 14 | Base 1 | Z-1 | R-1 R-2 | — | M-2 | E-1 | O-2 | 85 |
| 15 | Base 1 | Z-2 | R-1 R-2 | DAA | M-3 | E-1 | O-2 | 90 |
| 16 | Base 1 | Z-3 | R-1 R-2 | DAA | M-2 | E-1 | O-2 | 90 |
| 17 | Base 1 | Z-2 | R-1 R-2 | — | M-2 | E-1 | O-2 | 80 |
| 18 | Base 1 | Z-1 | R-1 R-2 | — | — | E-1 | O-2 | 120 |
| 19 | Base 1 | Z-2 | R-1 R-2 | DAA | M-2 | E-1 | O-2 | 70 |
| 20 | Base 1 | Z-1 | R-1 R-2 | DAA | M-1 | E-2 | O-1 | 80 |
| 21 | Base 1 | Z-2 | R-1 R-2 | DAA | M-2 | E-2 | O-2 | 90 |

TABLE 4

| Examples | Substrate | Photopolymerization initiating system | | | | | | Proper sensitivity (mj/cm²) |
|---|---|---|---|---|---|---|---|---|
| | | Sensitizing dye | Radical generating agent | Alkylamino compound | Aromatic mercapto compound | Ethylenic compound | Organic polymer material | |
| Examples 22 | Base 1 | Z-1 | R-2 | DAA | M-1 | E-1 | O-2 | 170 |
| 23 | Base 1 | Z-1 | R-2 | — | — | E-1 | O-2 | 200 |
| 24 | Base 2 | Z-1 | R-1 R-2 | DAA | M-1 | E-1 | O-2 | 80 |
| 25 | Base 2 | Z-1 | R-2 | DAA | M-1 | E-1 | O-2 | 82 |
| Comparative Examples 7 | Base 1 | Z-1 | R-1 | DAA | M-1 | E-1 | O-2 | 300 |
| 8 | Base 1 | Z-1 | R-1 | — | M-1 | E-1 | O-2 | 320 |
| 9 | Base 2 | Z-1 | R-1 | DAA | M-1 | E-1 | O-2 | 120 |
| 10 | Base 1 | Z-1 | R-3 | DAA | M-1 | E-1 | O-2 | 650 |

EXAMPLES 26 TO 29

Carbon black ("MA-220", manufactured by Mitsubishi Chemical Corporation) and an organic polymer material, of the types and amounts as identified in Table 5, and 250 parts by weight of cyclohexanone were mixed. The mixture was put into a paint shaker containing zirconia beads having a diameter of 0.5 mm in an amount 3.6 times by weight of the mixture, followed by dispersing for 17 hours. To the dispersion thereby obtained, a sensitizing agent, a radical generating agent, an ethylenic compound and, if necessary, a chain transfer agent, of the types and amounts as shown in the following table 5, and 250 parts by weight of cyclohexanone, were added to obtain a coating liquid.

The black colorant-containing photopolymerizable coating liquid thus prepared was coated by a wire bar coater on a glass substrate (No. 7059, manufactured by Corning Company) so that the dried film thickness would be 0.9 $\mu$m and dried at a drying temperature of 150° C. for one minute. Then, using a negative photomask for a black matrix repeating with a width of 30 $\mu$m and pitches of 330 $\mu$m in a longitudinal direction and 60 $\mu$m in a transverse direction, exposure was carried out by a 2 kw high pressure mercury lamp at a proper exposure as identified in Table 5. Then, using a developer made of an aqueous solution containing 0.25 wt % of potassium carbonate and 3 wt % of a nonionic surfactant (Newcol B-10, manufactured by Nippon Nyukazai K.K.), the sample was immersed therein at 25° C. for 30 seconds and then subjected to spray water washing by water washing spray of 2 kg/cm² for developing treatment to form a black matrix. Then, the sample was heat-cured by heat treatment at 200° C. for 7 minutes.

Further, in the same method, evaluation as shown in Table 5 was carried out.

TABLE 5

| | Sensitizing dye *1 | Radical generating agent *1 | Others *1 | Ethylenic compound *1 | Organic polymer material *1 | Drying temperature (°C.) | Concentration of colorant *2 | Optical density (ABS) [Film thickness ($\mu$m)] | Proper exposure (mj/cm$^2$) | Image quality |
|---|---|---|---|---|---|---|---|---|---|---|
| Example 26 | Z-2 (2) | R-1 (4) | — | E-2 (7.5) E-3 (7.5) | α (27) | 130 | 52 | 3.3 [0.9] | 1200 | A |
| Example 27 | Z-2 (2) | R-1 (4) | — | E-3 (15) | α (27) | 150 | 52 | 3.3 [0.9] | 500 | C |
| Example 28 | Z-2 (2) | R-1 (4) | — | E-4 (15) | α (27) | 150 | 30 | 1.9 [0.9] | 300 | B |
| Example 29 | Z-2 (2) | R-1 (4) | — | E-1 (7.5) E-3 (7.5) | α (27) | 150 | 52 | 3.3 [0.9] | 350 | A |
| Example 30 | Z-1 (2) | R-1 (4) | — | E-2 (7.5) E-3 (7.5) | α (27) | 150 | 52 | 3.3 [0.9] | 600 | A |

*1 The numeral in the bracket represents parts by weight
*2 The numeral represents the concentration by weight, based on the total solid content of the resist.

The proportion of the colorant contained in the solid content of the black colorant photopolymerizable coating liquid Colorant concentration=weight of the colorant/weight of the total solid content Proper exposure A ugra test chart was placed on a sample, and from above the chart, exposure was conducted by a 2 kw high pressure mercury lamp while changing the exposure. Then, developing treatment was applied thereto, and the exposure when the line widths of the finest positive and negative lines in the fine line images of the obtained ugra test chart image became the same, was taken as the proper exposure. F indicates that no image was formed for the reason that the light sensitive layer was completely dissolved or was not dissolved at all in the developing treatment.

Image quality

In the same manner as described above, the coating liquid of the colorant photopolymerizable composition was coated on a glass substrate and dried, and then using a ugra test chart, the sample was exposed with a proper exposure and subjected to developing treatment by means of a standard developing solution to form a colorant image. The fine line images in the colorant image were observed by a microscope with 400 magnifications, whereby from the line widths of the reproduced finest lines, the image quality was evaluated in accordance with the following standards. The finer the reproduced lines, the better the image.

A: Fine lines with line widths of less than 10 $\mu$m were reproduced.

B: Fine lines with line widths of from 10 to 15 $\mu$m were reproduced.

C: Fine lines with line widths of from 15 to 25 $\mu$m were reproduced.

D: Fine lines with line widths of more than 25 $\mu$m were reproduced.

Optical density

Using a Macbeth densitometer (TD-904), the optical density (ABS) of a sample was measured. The thickness of the photosensitive layer of the sample was measured by an α-step manufactured by Tencol Instruments Company and shown in [].

E-1:

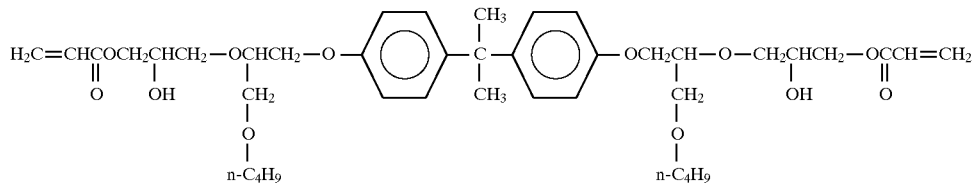

E-2:

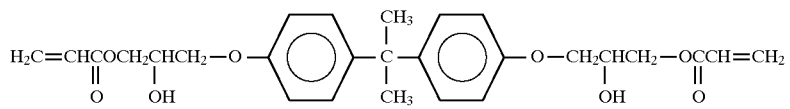

E-3:

Dipentaerythritol hexaacrylate (DPHA)

Organic polymer material

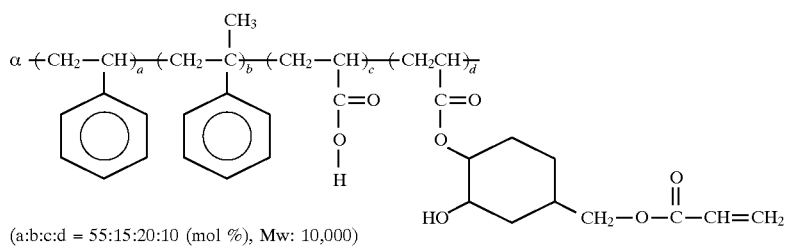

(a:b:c:d = 55:15:20:10 (mol %), Mw: 10,000)

Sensitizing agents

Z-1:

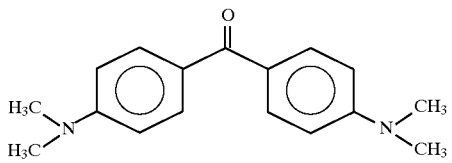

Z-2:

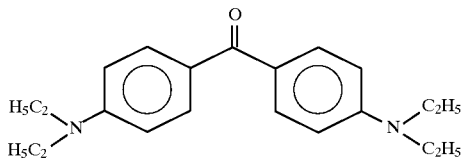

Z-3:

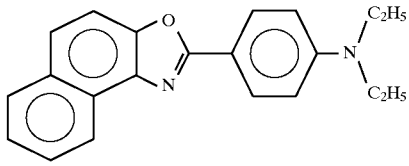

Z-4:

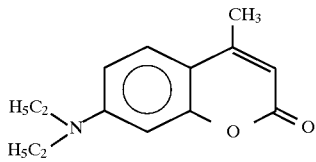

Z-5:

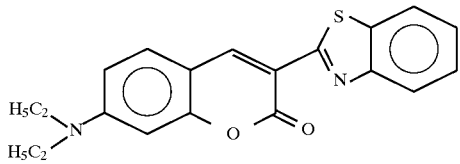

Radical generating agent
R-1: Di-cyclopentadienyl-Ti-bis-2,6-difluoro-3-(pyrr-1-yl)-phen-1-yl
Chain transfer agent
X-1: Ethyl p-dimethylaminobenzoate

EXAMPLE 31

The test and the evaluation were carried out in the same manner as in Example 27, except that the colorant was changed to the one identified below, whereby the optical density was 1.54 [0.75] and the proper exposure was 100 mj/cm$^2$.

Blue pigment: Lionol Blue ES (manufactured by Toyo Ink Seizo K.K.)/Lionogen Violet RL (manufactured by Toyo Ink Seizo K.K.)(=13.5/3.5 (weight ratio))

EXAMPLE 32

The test and the evaluation were carried out in the same manner as in Example 27, except that the colorant was changed to the one identified below, whereby the optical density was 1.06 [0.75], and the proper exposure was 110 mj/cm$^2$.

Red pigment: Lionogen Red GD (manufactured by Toyo Ink Seizo K.K.)/Lionogen Orange R (manufactured by Toyo Ink Seizo K.K.)(=13/5 (weight ratio))

EXAMPLES 33 TO 49

Carbon black ("MA-220", manufactured by Mitsubishi Chemical Corporation) and an organic polymer material, of the types and the amounts as identified in the following Table 6, and 400 parts by weight of cyclohexanone were mixed. The mixture was put into a paint shaker containing zirconia beads having a diameter of 0.5 mm in an amount of 3.6 times by weight of the mixture, followed by dispersing for 17 hours. To the obtained dispersion, a sensitizing agent, a radical generating agent, an ethylenic compound and, if necessary, a chain transfer agent, of the type and the amounts as identified in the following Table 6, and 400 parts by weight of cyclohexanone, were added to obtain a coating liquid.

Ethylenic compounds

E-1:

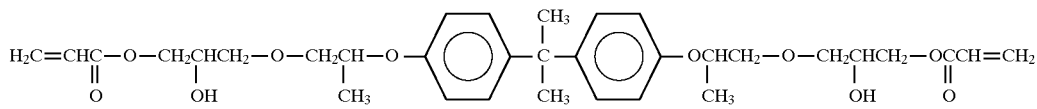

E-2:

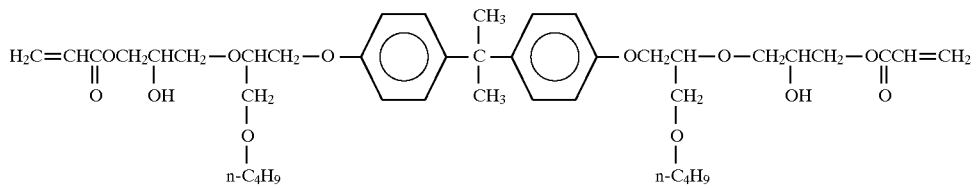

E-3:

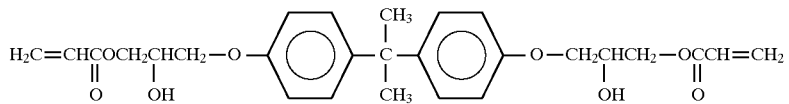

E-4:
Dipentaerythritol hexaacrylate (DPHA)

E-5:
Trimethylolpropane triacrylate (TMPTA)

Organic polymer material

α

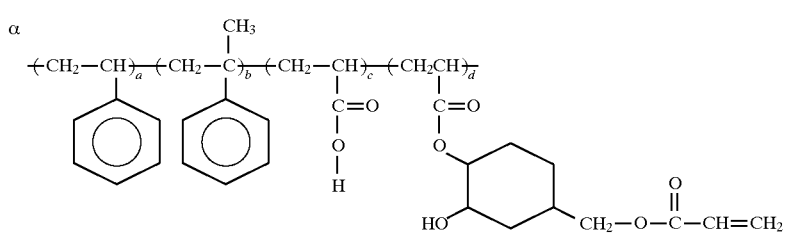

(a:b:c:d = 55:15:20:10 (mol %), Mw: 10,000)

Sensitizing agents

Y-1:

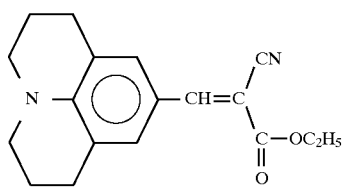

Y-2:

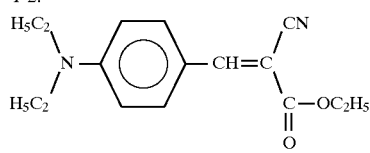

Y-3:

-continued

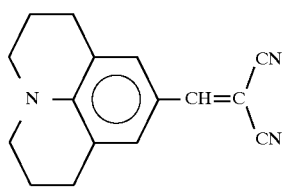

Y-4:
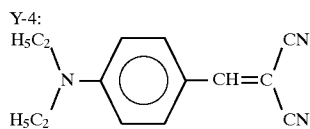

Y-5:
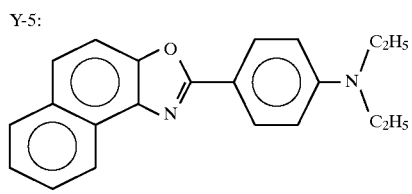

Y-6:
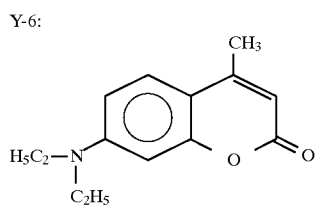

Y-7:
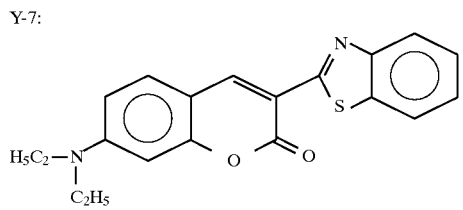

Radical generating agent
R-1: Dicyclopentadienyl-Ti-bis-2,6-difluoro-3-(pyrr-1-yl)-phen-1-yl
Chain transfer agent
X-1: Ethyl p-dimethylaminobenzoate The black colorant-containing photopolymerizable coating liquid thus prepared was coated by a wire bar coater on a glass substrate (No. 7059, manufactured by Corning Company) so that the dried film thickness would be 1.9 μm and dried at a drying temperature of 150° C. for one minute. Then, using a negative photomask for a black matrix repeating with a width of 30 μm and pitches of 330 μm in a longitudinal direction and 110 μm in a transverse direction, exposure was conducted by a 2 kw high pressure mercury lamp with a proper exposure as identified in Table 6. Then, using a developer made of an aqueous solution containing 0.25 wt % of potassium carbonate of 3 wt % of a nonionic surfactant (Newcol B-10, manufactured by Nippon Nyukazai K.K.), the sample was immersed therein at 25° C. for 30 seconds and then subjected to spray washing by a water spray of 2 Kg/cm² for developing treatment to form a black matrix. Then, the sample was heat-cured by heat treatment at 200° C. for 7 minutes.

Further, in the same manner, evaluation as shown in Table 6 was carried out.

TABLE 6

| | Sensitizing dye *1 | Radical generating agent *1 | Others *1 | Ethylenic compound *1 | Organic polymer material *1 | Drying temperature (°C.) | Concentration of colorant *2 | Optical density (ABS) [Film thickness (μm)] | Proper exposure (mj/cm²) | Image quality |
|---|---|---|---|---|---|---|---|---|---|---|
| Example 33 | Y-1 (2) | R-1 (4) | — | E-3 (7.5) E-4 (7.5) | α (27) | 130 | 52 | 3.3 [0.9] | 1400 | A |
| Example 34 | Y-1 (2) | R-1 (4) | — | E-3 (7.5) E-4 (7.5) | α (27) | 140 | 52 | 3.3 [0.9] | 700 | A |
| Example 35 | Y-1 (2) | R-1 (4) | — | E-3 (7.5) E-4 (7.5) | α (27) | 150 | 52 | 3.3 [0.9] | 350 | A |

TABLE 6-continued

| | Sensitizing dye *1 | Radical generating agent *1 | Others *1 | Ethylenic compound *1 | Organic polymer material *1 | Drying temperature (°C.) | Concentration of colorant *2 | Optical density (ABS) [Film thickness (μm)] | Proper exposure (mj/cm²) | Image quality |
|---|---|---|---|---|---|---|---|---|---|---|
| Example 36 | Y-1 (15) | R-1 (4.5) | — | E-3 (7.5) E-4 (7.5) | α (27) | 150 | 52 | 3.3 [0.9] | 300 | A |
| Example 37 | Y-1 (3) | R-1 (3) | — | E-3 (7.5) E-4 (7.5) | α (27) | 150 | 52 | 3.3 [0.9] | 500 | A |
| Example 38 | Y-1 (4) | R-1 (2) | — | E-3 (7.5) E-4 (7.5) | α (27) | 150 | 52 | 3.3 [0.9] | 1500 | A |
| Example 39 | Y-1 (1) | R-1 (2) | — | E-3 (7.5) E-4 (7.5) | α (27) | 150 | 52 | 3.3 [0.9] | 700 | A |
| Example 40 | Y-1 (2) | R-1 (4) | — | E-3 (7.5) E-4 (7.5) | α (27) | 150 | 65 | 4.0 [0.9) | 600 | A |
| Example 41 | Y-1 (2) | R-1 (4) | — | E-4 (15) | α (27) | 150 | 52 | 3.3 [0.0] | 600 | C |
| Example 42 | Y-1 (2) | R-1 (4) | — | E-4 (15) | α (27) | 150 | 30 | 1.9 [0.9] | 350 | B |
| Example 43 | Y-1 (2) | R-1 (4) | — | E-3 (21) E-4 (21) | — | 150 | 52 | 3.3 [0.9] | 400 | B |
| Example 44 | Y-1 (2) | R-1 (4) | — | E-3 (7.5) E-4 (7.5) | α (27) | 150 | 52 | 3.3 [0.9] | 500 | A |
| Example 45 | Y-1 (2) | R-1 (4) | — | E-2 (7.5) E-4 (7.5) | α (27) | 150 | 52 | 3.3 [0.9] | 400 | A |
| Example 46 | Y-1 (1.5) | R-1 (3) | X-1 (1.5) | E-3 (7.5) E-4 (7.5) | α (27) | 150 | 52 | 3.3 [0.9] | 320 | A |
| Example 47 | Y-1 (2) | R-1 (4) | — | E-1 (7.5) | — | 150 | 52 | 3.3 [0.9] | 330 | A |
| Example 48 | Y-3 (2) | R-1 (4) | — | E-3 (7.5) E-4 (7.5) | α (27) | 150 | 52 | 3.3 [0.9] | 350 | A |
| Example 49 | Y-4 (2) | R-1 (4) | — | E-1 (7.5) E-5 (7.5) | α (27) | 150 | 52 | 3.3 [0:9] | 350 | A |

*1 The numeral in the bracket represents parts by weight.
*2 The numeral represents the concentration by weight, based on the total solid content of the resist.

EXAMPLE 50

1.5 g of carbon black ("MA-100", manufactured by Mitsubishi Chemical Corporation) and 1.0 g of an acryl resin shown by the following formula 1 as a dispersant, were

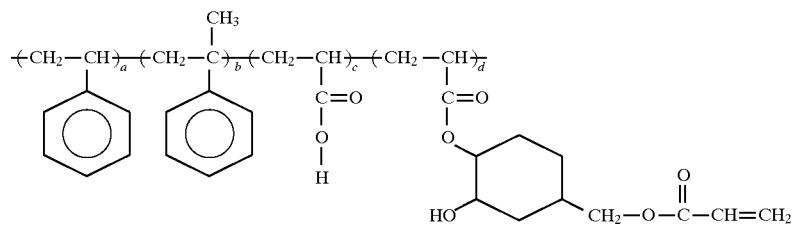

$(a:b:c:d=55:15:20:10 \text{ (mol \%)}, Mw: 12,000)$ mixed to 7.5 g of PGMEA and 10 cc of zirconia beads having a particle diameter of 0.5 mm were added thereto. The mixture was shaked by a paint conditioner for 1 hour to obtain a dispersion of carbon black. 2 g of this dispersion was taken, and 0.075 g of dipentaerythritol hexaacrylate ("DPHA", manufactured by Nippon Kayaku K.K.) as the ethylenic compound, 0.075 g of an epoxy acrylate type monomer ("SP-1509", manufactured by Showa Kobunshi K.K.=the polymer obtained from acrylation of co-condensation polymer of bisphenol A with epichlorohydrin, viscosity: 10,000 cps/25° C.), 0.003 g of Michler's ketone (manufactured by Showa Kobunshi K.K.), 0.007 g of di-cyclopentadienyl-Ti-bis-2,3,5,6-tetrafluorophen-1-yl, 0.007 g of 2-2'-bis-(o-chlorophenyl)-4,4'-5,5'tetraphenylbiimidazole and 0.007 g of 2-mercapto benzothiazole, as the photopolymerization initiating system, and 3.72 g of PGMEA as an organic solvent, were added to obtain a black resist.

The obtained black resist was coated on a glass substrate ("7059", manufactured by Corning Company, thickness; 1.1 mm) which was previously treated by high pressure water washing and ultraviolet ray/ozone treatment, by a spin coating method and dried on a hot plate of 130° C. to obtain a black resist film having a thickness of 0.9 μm. This resist film was exposed over the entire surface with 250 mj/cm² of ultraviolet rays and then developed with a 0.5 wt % of sodium carbonate aqueous solution to form a black resist pattern on the glass substrate.

To the obtained pattern, ultraviolet rays were irradiated from both the substrate side and the resist side with a dose of 15,000 mj/cm² by means of high pressure mercury lamps. Then, in an oven of 200° C., heat treatment was applied for 10 minutes to obtain a black matrix having an optical density of 2.84 (as measured by the visual spectral characteristic by TR927 Macbeth densitometer) and a film thickness of 0.8 µm. The content of the black colorant in the black matrix was 48 wt %.

The obtained black matrix was left to stand in an oven at 230° C. for one hour, and the optical densities before and after the heat treatment were measured, whereby the results as shown in Table 1 were obtained. Thus, it was confirmed that a black matrix having excellent heat resistance was obtained.

TABLE 7

| Before heat treatment | After heat treatment | Reduction |
| --- | --- | --- |
| 2.84 | 2.84 | 0% |

EXAMPLE 51

A black matrix obtained in the same manner as in Example 50 was immersed in N-methylpyrrolidone at 25° C. for 5 minutes, and the optical densities before and after the immersion were measured to determine the change. The results as shown in Table 2 were obtained. Thus, it was confirmed that a black matrix having excellent solvent resistance was obtained.

TABLE 8

| Before immersion | After immersion | Reduction |
| --- | --- | --- |
| 2.84 | 2.84 | 0% |

EXAMPLE 52

A black matrix prepared in the same manner as in Example 50 was subjected to a pressure cooker test at 100° C. under 3 atm at a relative humidity of 100% by means of PC-522RIII, manufactured by Hirayama Seisakusho, and the adhesion of the resist film was evaluated by the methods disclosed in JIS-5400, whereby evaluation scores were 10 points in both the cross cut tape method and the X cut tape method. Thus, it was confirmed that a black matrix having excellent adhesion was obtained.

EXAMPLE 53

A black matrix prepared in the same manner as in Example 50 was scraped off from the substrate and heated from 80° C. to 230° C. at a rate of 5° C./min by thermal expulsion gas chromatography (column=PEG-20M, 15%, 2 m), whereby any volatile components, impurities or decomposition products were not detected, as being less than 0.05% which is the limit for measurement.

EXAMPLE 54

1.6 g of carbon black ("MA-100", manufactured by Mitsubishi Chemical Corporation) and 0.9 g of an acryl resin of the above formula 1 as the dispersant were mixed to 7.5 g of PGMEA, and 10 cc of zirconia beads having a particle diameter of 0.5 mm were added thereto. The mixture was shaken for 10 hours by a paint conditioner to obtain a dispersion of carbon black. 3 g of this dispersion was taken, and 0.075 g of dipentaerythritol hexaacrylate ("DPHA", manufactured by Nippon Kayaku K.K.) and 0.075 g of an epoxy acrylate type monomer ("SP-1509", manufactured by Showa Kobunshi K.K.), as ethylenic compounds, 0.003 g of Michler's ketone (manufactured by Showa Kobunshi K.K.), 0.007 g of di-cyclopentadienyl-Ti-bis-2,3,5,6-tetrafluorophen-1-yl, 0.007 g of 2,2'-bis(o-chlorophenyl)-4, 4',5,5'-tetraphenylbiimidazole and 0.007 g of 2-mercapto benzothiazole, as the photopolymerization initiating system, and 2.6 g of PGMEA as an organic solvent were added to obtain a black resist.

The obtained black resist was coated on a glass substrate ("7059", manufactured by Corning Company, thickness: 1.1 mm) which was previously treated by high pressure water washing and ultraviolet ray-ozone treatment, by a spin coating method and dried on a hot plate of 130° C. to obtain a black resist film having a thickness of 0.9 µm. This resist film was exposed over the entire surface with 250 mj/cm$^2$ of ultraviolet rays, and then developed with a 0.5 wt % sodium carbonate aqueous solution to form a black resist pattern on the glass substrate.

To the obtained pattern, ultraviolet rays were irradiated from both the substrate side and the resist side at a dose of 15,000 mj/cm$^2$ by means of high pressure mercury lamps. Then, heat treatment was applied in an oven of 200° C. for 10 minutes to obtain a black matrix having an optical density of 3.30 (as measured by visual spectral characteristics by TR927 Macbeth densitometer) and a film thickness of 0.85 µm. The content of the black colorant in the black matrix was 52 wt %.

The obtained black matrix was left to stand in an oven of 230° C. for one hour, and the optical densities before and after the heat treatment were measured, whereby the following results were obtained. Thus, it was confirmed that a black matrix having excellent heat resistance was obtained.

TABLE 9

| Before heat treatment | After heat treatment | Reduction |
| --- | --- | --- |
| 3.30 | 3.30 | 0% |

EXAMPLE 55

A black matrix obtained in the same manner as in Example 54 was immersed in N-methylpyrrolidone at 25° C. for 5 minutes, and the optical densities before and after the immersion were measured to determine the change, whereby the following results were obtained. Thus, it was confirmed that a black matrix having excellent solvent resistance was obtained.

TABLE 10

| Before immersion | After immersion | Reduction |
| --- | --- | --- |
| 3.30 | 3.30 | 0% |

EXAMPLE 56

A black matrix obtained in the same manner as in Example 54 was subjected to a pressure cocker test at 100° C. under 3 atm at a relative humidity of 100% by means of PC-422 RIII, manufactured by Hirayama Seisakusho, and the adhesion of the resist film was evaluated by the methods disclosed in JIS 5400, whereby evaluation scores were 10 points in both the cross cut tape method, and the X cut tape method. Thus, it was confirmed that a black matrix excellent in the adhesion was obtained.

EXAMPLE 57

A black matrix prepared in the same manner as in Example 54 was scraped off from the substrate and heated from 80° C. to 230° C. at a rate of 5° C./min by thermal expulsion gas chromatography (column: PEG-20M, 15%, 2 m), whereby any volatile components, impurities and decomposition products were not detected, as being less than 0.05% which is the limit for measurement.

As described in detail in the foregoing, the photopolymerizable composition for a color filter of the present invention contains a titanocene compound, preferably also an alkylamino compound, as the photopolymerization initiating system, whereby the exposure sensitivity is high, and the development property and the storage stability in the form of a solution, are excellent, and whereby a color filter can be produced constantly and efficiently at a high line speed.

The composition for a black matrix of the present invention provides an excellent light shielding property with an optical density of at lest 2.8 in a film thickness of at most 1.0 $\mu$m and provides practically adequate heat resistance, chemical resistance and moisture resistance and which provides a black matrix for a color filter having a remarkably high quality containing substantially no volatile component, impurity or thermally decomposable component.

What is claimed is:

1. A photopolymerizable composition for a color filter, which comprises a compound having at least one ethylenically unsaturated double bond, a photopolymerization initiator, and a black colorant and which, when formed into a coating film having a dried film thickness of at most 1 $\mu$m, has an optical density of at least 2.8, and which contains at least 40 wt. %, as a solid content concentration, of carbon black, as the black colorant.

2. The photopolymerizable composition for a color filter according to claim 1, wherein the reduction in the optical density by heat treatment of the coating film at a temperature of 230° C. for one hour, is at most 5%.

3. The photopolymerizable composition for a color filter according to claim 1, wherein the reduction in the optical density after immersing the coating film in N-methylpyrrolidone at 25° C. for 25 minutes, is at most 5%.

4. The photopolymerizable composition for a color filter according to claim 1, wherein when the coating film is subjected to a pressure cooker test at 10° C. under 3 atm at a relative humidity of 100% for 3 hours and then the adhesion is evaluated by a cross cut tape method and/or a X cut tape method in accordance with JIS K 5400, the evaluation score is at least 8 points.

5. The photopolymerizable composition for a color filter according to claim 1, wherein the optical density of the coating film is at lest 2.8, and the volatile component detected is at most 0.1%, as measured up to 230° C. by thermal expulsion gas chromatography.

6. A black matrix for a color filter comprising the photopolymerizable composition for a color filter according to claim 1.

7. A color filter comprising a substrate, a black matrix, a red colorant image, green colorant image and a blue colorant image formed thereon, wherein the black matrix comprises the polymerizable composition for a color filter according to claim 1.

8. A photopolymerizable composition for a color filter, which comprises a compound having at least one ethylenically unsaturated double bond, a photopolymerization initiator, and a black colorant and which, when formed into a coating film having a dried film thickness of at most 1 $\mu$m, has an optical density of at least 2.5, wherein said photopolymerization initiator comprises a titanocene compound.

9. The photopolymerizable composition for a color filter according to claim 8, which further contains an alkylamino compound and/or a hexaarylbiimidazole compound.

10. The photopolymerizable composition for a color filter according to claim 9, which further contains an aromatic mercapto compound.

11. The photopolymerizable composition for a color filter according to claim 8, which further contains an aromatic mercapto compound.

12. A color filter comprising a substrate, a black matrix, a red colorant image, green colorant image and a blue colorant image formed thereon, wherein the black matrix comprises the photopolymerizable composition for a color filter according to claim 8.

13. A black matrix for a color filter comprising a photopolymerized composition having carbon black dispersed therein, a thickness of at most 1 $\mu$m, and an optical density of at least 2.8, and which contains at least 40 wt. % of carbon black as the black colorant.

14. A black matrix for a color filter according to claim 13, which contains from 50 to 70 wt. % of carbon black as the black colorant.

* * * * *